(12) United States Patent
Yuzawa et al.

(10) Patent No.: US 6,557,106 B1
(45) Date of Patent: Apr. 29, 2003

(54) POWER ENABLING MECHANISM, A POWER ENABLING METHOD, AND A CONTROLLER FOR AN INPUT/OUTPUT DEVICE

(75) Inventors: Shigeru Yuzawa, Yamato (JP); Satoshi Karube, Kamakura (JP)

(73) Assignee: International Business Machines Corporation, Armonk, NY (US)

( * ) Notice: Subject to any disclaimer, the term of this patent is extended or adjusted under 35 U.S.C. 154(b) by 1172 days.

(21) Appl. No.: 08/571,064

(22) Filed: Dec. 12, 1995

(30) Foreign Application Priority Data

Dec. 15, 1994 (JP) .............................. 6-311419

(51) Int. Cl.[7] .............................. G06F 13/00
(52) U.S. Cl. .................................. 713/300
(58) Field of Search .............. 365/226, 229, 365/189.05, 228; 395/750

(56) References Cited

U.S. PATENT DOCUMENTS 4,471,237 A * 9/1984 Kaplan ...................... 307/443
4,926,288 A * 5/1990 Bradley ...................... 361/101
5,262,933 A * 11/1993 Shyi-Hon ...................... 363/49
5,283,474 A * 2/1994 Oi et al. ...................... 307/116
5,291,454 A * 3/1994 Yamasaki et al. ............ 365/226
5,382,839 A * 1/1995 Shinohara ...................... 327/545
5,490,117 A * 2/1996 Oda et al. .................... 365/226
5,532,898 A * 7/1996 Price .......................... 361/119
5,585,994 A * 12/1996 Tamai et al. .................. 361/98

FOREIGN PATENT DOCUMENTS

JP          5-224785        9/1993

* cited by examiner

Primary Examiner—David Wiley
(74) Attorney, Agent, or Firm—Lawrence D. Cutter (57) ABSTRACT

An input/output device controller supplies power to a PC card in a secure manner. A PC card is a device that is loaded into a slot of a personal computer. The input/output device controller, which permits an information processing apparatus to communicate with an input/output device, operates in a manner so that when an abnormality is detected in the supply of operating power to the PC card, the detection result is reported to the personal computer. When an abnormality in the supply of operating power to the PC card is detected, the output of a driver for the PC card is halted so as to prevent the destruction of the internal circuitry of the PC card due to latch-up problems.

15 Claims, 8 Drawing Sheets

POWER ENABLING MECHANISM, A POWER ENABLING METHOD, AND A CONTROLLER FOR AN INPUT/OUTPUT DEVICE

FIELD OF THE INVENTION

The present invention relates to a power enabling mechanism, a power enabling method, and an input/output device controller for controlling a supply of power by an information processing apparatus to an input/output device that is attached to it; and in particular, it relates to a power enabling mechanism, a power enabling method, and an input/output device controller for controlling a supply of power to a PC card, which is inserted into the slot of a personal computer (PC) so as to be detachable. More specifically, the present invention pertains to a power enabling mechanism, a power enabling method, and an input/output device controller for securing a supply of power to a PC card that is loaded into a slot of a personal computer and for preventing a voltage decrease and a circuit fault of a PC, and the latch-up of a PC card even when power consumption for a PC card is abnormal (or there is a large consumption of power that exceeds an established standard).

BACKGROUND OF THE INVENTION

Because of recent developments in packaging technique, the use of desktop and laptop (or notebook) personal computers (PCs) has become widespread.

Since a PC is generally compact or portable, the standard hardware resources that can be mounted at the shipping stage are limited. A user can, therefore, assemble his own system by attaching desired input/output devices to ports and/or to connectors in the PC.

Figure 10:
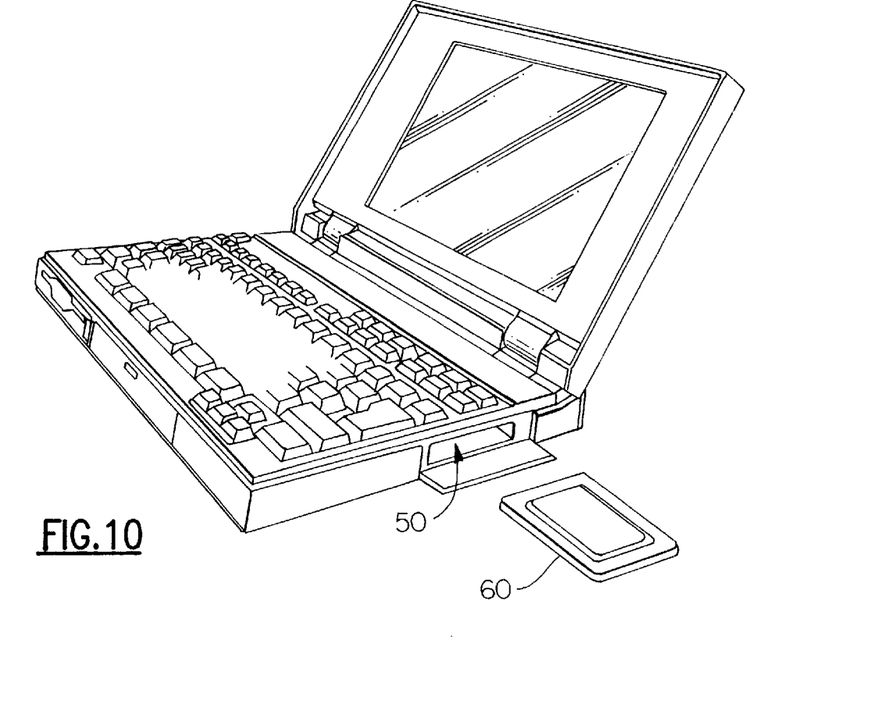
FIG. 10 is a diagram showing a notebook computer where a PC card slot is provided on the side of the computer body.

A so-called PC card is a specific example of an input/output device for an expandable PC. The physical specifications and the electric specifications for PC cards are established mainly by the PCMCIA (Personal Computer Memory Card International Association) and JEIDA (Japan Electronic Industry Development Association). Although the standards for PC cards were only memory card specifications at the beginning, I/O card specifications were added later, and now various types of cards, such as facsimile modems, SCSIs (Small Computer System Interfaces), hard disks, and LAN (Local Area Network) adaptors, are commercially available. At the present, for most PCs the expansion of hardware resources is ensured by the provision of one or more slots into which these PC cards can be inserted (see FIG. 10). In addition to PC cards being compact and easy to exchange, PC cards support a function whereby they can be attached to and detached from a PC while it is powered on (the so-called "active insertion and extraction" or "Plug and Play" function), and thus make easier exchange or expansion using PC cards.

Figure 11:
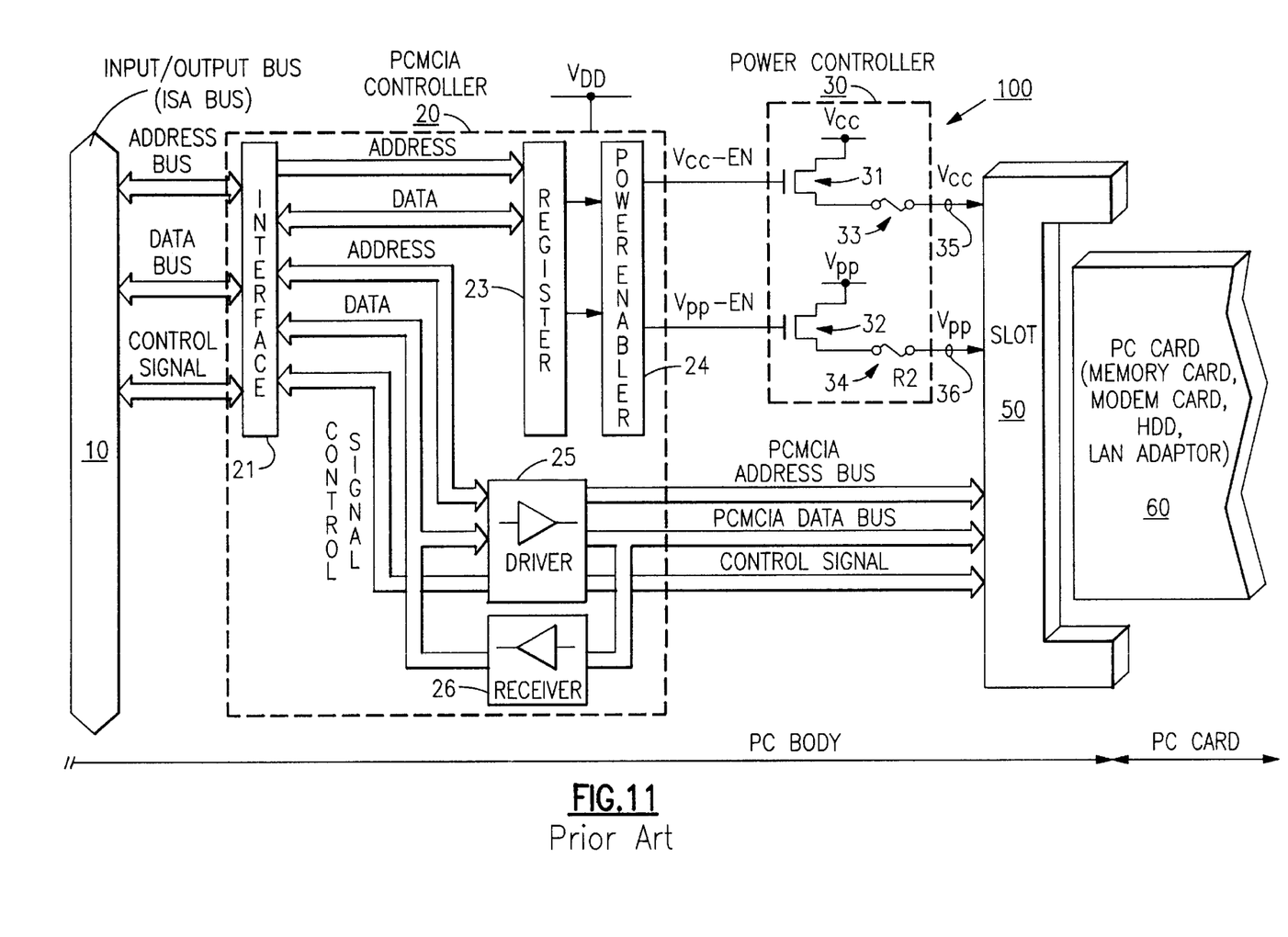
FIG. 11 is a schematic diagram illustrating a conventional hardware arrangement 100 with which a PC communicates with a PC card 60 that conforms to the standards specified by PCMCIA/JEIDA.

FIG. 11 is a diagram illustrating the (conventional) schematic arrangement 100 of hardware by which a PC communicates with a PC card 60 that conforms to the specifications established by PCMCIA/JEIDA. PC card 60 is mechanically loaded into expansion PC slot 50 wherein it is electrically connected, via PCMCIA controller 20, to input/output bus 10 of the PC. Input/output bus 10 is a common transfer path for the exchange of data by a CPU (not shown) and individual input/output devices, and conforms to, for example, the ISA (Industry Standard Architecture) bus standard.

PCMCIA controller 20 is a controller chip for enabling connection of the PC to PC card 60. From the point of view of data distribution, PCMCIA controller 20 communicates with input/output bus 10 of the PC via interface 21, and communicates with the PC card 60 via a driver 25 and a receiver 26. Interface 21 is connected to an address signal line, a data signal line, and a control signal line of input/output bus 10 (generally, address signals are transmitted in one direction from the PC, and data signals and control signals are transmitted bidirectionally). Through interface 21, operational timings between the PC and PC card 60 are matched and data expression forms are converted. Driver 25 drives PC card 60 in accordance with the contents carried in a control signal. Driver 25 receives from interface 21 an address signal, a data signal, and a control signal that are transmitted in one direction and driver 25 sends them to PC card 60. The function of driver 25 can be understood by explaining that driver 25 is an output buffer that transmits an electric signal to PC card 60. By way of contrast, receiver 26 receives data from PC card 60 and transmits it to interface 21. Receiver 26 relays data signals that are transmitted in the return direction. Register 23 is a circuit for temporarily storing specific data, and receives part of the address signals and the data signals that are transmitted via the interface 21. Register 23 includes an address for writing a value that is designated by configuration software of the PC, an address for writing the load state of PC card 60, and an address for writing an instruction ($V_{CC}$ bit and $V_{PP}$ bit) for the supply of power to PC card 60 (which will be described later). The PC can access the individual addresses of register 23 during an I/O read cycle.

According to the standards specified by PCMCIA/JEIDA, the PC is so designed that it provides two system power lines 35 and 36 for which the voltage levels, $V_{CC}$ and $V_{PP}$, differ according to which PC card 60 is involved. Generally, power line 35 is employed to apply a reference voltage $V_{CC}$ (3.3 V or 5 V) that PC card 60 requires for normal operation. Power line 36 is employed to provide voltage $V_{PP}$ for an optional upgrade operation (for example, for a PC card that has non-volatile memory, such as flash ROM, may employ voltage $V_{PP}$ for erasing data from and the writing data to the non-volatile memory) that requires a comparatively high voltage (or an auxiliary voltage $V_{CC}$). According to the specifications, some PC cards 60 use only $V_{CC}$ while others use both $V_{CC}$ and $V_{PP}$. PCMCIA controller 20 not only controls the exchange of data between the PC and PC card 60, but also controls the supply of power by the PC to PC card 60. More specifically, a power enabler 24, which is in PCMCIA controller 20, and a power controller 30 cooperate in the process. Power enabler 24 is provided with the $V_{CC}$ bit and the $V_{PP}$ bit in register 23, and enables or disables control signals $V_{CC}$_En and $V_{PP}$_En, which are employed to instruct the connection/disconnection of power lines 35 and 36, in consonance with the setting or clearing of bits. Switches 31 and 32 of power controller 30 are opened or closed, in response to the outputs of $V_{CC}$_En and $V_{PP}$_En, to supply or to cut off voltages $V_{CC}$ and $V_{PP}$. P-channel MOSFETs or bipolar transistors, for example, may be used for switches 31 and 32. PCMCIA controller 20 is driven by system voltage $V_{DD}$, which is different than $V_{CC}$ and $V_{PP}$.

It is assumed that a PC card (especially, a PC card that conforms to PCMCIA/JEIDA standards) is frequently loaded into and unloaded from a PC, and various PC card types that are produced by many makers are now commercially available. However, almost nothing concerning the consumption of power by PC cards is contained in the current standards that are specified for PC cards. There are PC cards that have a large power consumption that exceeds the power supply capabilities of the PC card power circuits that are provided in the PCs, and there have been some instances where such PC cards have been loaded into the slots of PCs. In another cases, the power sources are short-circuited to the GND (ground) because of the abnormalities of internal circuits of the PC cards. Further, since the present I/O card standards that were specified for PC cards were added to the original standards that were specified for memory cards, cards such as hard disk cards (so-called Type III cards), whose power consumption is large (although neither abnormal nor over current), have been loaded into slots that were intended for memory cards. When the power consumption of a loaded PC card is unexpectedly great, the PC card power supply circuit in the PC and the power circuit of the PC itself may be destroyed, and the data contents of the memory for the PC will be lost.

In short, there are no established standards that cover power consumption by PC cards, and the internal state of PC cards cannot be determined at a glance. In spite of these problems, frequent active insertion, and extraction, of PC cards occurs as a consequence of the principle of "Plug and Play". Nonetheless, power protection countermeasures for PC cards are still very important.

To provide a secure supply of power for PC cards, conventional, over-current protection circuits are located in the power lines. Fuses 33 and 34 that are inserted in series on power lines 35 and 36 in FIG. 11 are equivalent to such circuits. However, over-current protection that involves the use of fuses has the following problems:

(1) Generally, fuses 33 and 34 that are employed for the power controller 30 are chip types that are assembled on a board by soldering, and replacing them is not easy, even if they can be cut off. Accordingly, once the fuses have blown, even when a normal PC card is loaded in to the slot, the PC card is not activated.

(2) Generally, the fuses are components that have a low response speed, so that over-current flows to the PC card for a moment until the fuses are blown. Since an excess current flows to the PC card and the voltage within the PC is reduced, the operation of the PC may be halted and the contents of the main memory may be damaged.

(3) When the PC card is not activated because the PC card causes the fuses to blow, there is no interface, specified by PCMCIA/JEIDA, which can report the cause of the fault to a user or to the PC. Since the user is not aware of the abnormality, in many cases he inserts the PC card, which contains the abnormality, into other slots on the same PC or another PC, one after another, to try to determine what is wrong. This is more often performed with PC cards for which detachment is made easier for Plug-and-Play purposes. The repetitious attempts to determine what is wrong may cause the fuses of every PC card slot to be blown. Further, since the driver for the PCMCIA controller is maintained in the ON state while there is no power supplied to the PC card, the PC, to which the abnormality is not reported, will try to access the PC card. However, since the circuit components, such as transistors, can switch the input signal properly only upon the application of a drive voltage, and can not be activated when no drive voltage is applied, a current may flow in an unexpected direction within the PC components or between the components. As a result, some signals may cause a large current drop, and the internal circuit of the PC card may be destroyed by the latch-up. Furthermore, when the fuses have blown only on the $V_{CC}$ side, only the voltage $V_{PP}$ is available to drive the PC card. The application of the $V_{PP}$ voltage alone, which is originally optional, is counter to the specifications and creates a dangerous condition for PC cards.

There is one method where information concerning the power consumption of the PC card is written, as part of the card attribute information (CIS), into an internal ROM on the PC card so that the PC can read that information. However, as power must be supplied to the PC card in order for the information to be read from the ROM, this method does not provide complete protection.

As is described above, when a power abnormality occurs on a PC card, it is imperative that the supply of power be halted before the PC is damaged and that information concerning the occurrence of the abnormality be transmitted to the system of the PC.

OBJECTIVES OF THE INVENTION

It is an object of the present invention to provide a power enabling mechanism, a power enabling method, and an input/output device controller for controlling a supply of power by an information processing apparatus to an input/output device that is loaded into it.

It is another object of the present invention to provide a power enabling mechanism, a power enabling method, and an input/output device controller for controlling supply of power to a PC card that is loaded into a slot of a personal computer (PC).

It is an additional object of the present invention to provide a power enabling mechanism, a power enabling method, and an input/output device controller for securely supplying power to a PC card that is loaded into a slot of a personal computer, and for preventing a voltage reduction and a circuit fault of the PC and the latch-up of the PC card especially when power consumption by the PC card is abnormal (or a large power consumption exceeds specified standards).

SUMMARY OF THE INVENTION

To achieve the above objects, according to a first aspect of the present invention, a power enabling mechanism, which controls supply of power by an information processing apparatus to a detachable input/output device, comprises: a first power line for supplying power at a first voltage level; a second power line for supplying power at a second voltage level; a first detector for detecting an over-current in the first power line; a second detector for detecting an over-current in the second power line; disjunctive circuit means (a logical OR gate) for logically adding the outputs of the first and the second detectors; a first switch that is employed for connection and disconnection of the first power line in response to an output of the disjunctive circuit means; and a second switch that is employed for connection and disconnection of the second power line in response to an output of the disjunctive circuit means.

According to a second aspect of the present invention, a power enabling mechanism, which controls supply of power from an information processing apparatus to a detachable input/output device, comprises: a first power line for supplying power at a first voltage level, a second power line for supplying power at a second voltage level, a first detector for detecting an overcurrent in the first power line, a second detector for detecting an over-current in the second power line, OR gate means for logically adding the outputs of the first and the second detectors, a first switch that is employed for connection and disconnection of the first power line in response to an output of the OR gate means, a second switch that is employed for connection and disconnection of the second power line in response to an output of the OR gate means; and also employs the OR gate means also to report the output to the information processing apparatus.

According to a third aspect of the present invention, a power enabling mechanism, which controls supply of power from an information processing apparatus to a detachable input/output device, comprises: a first power line for supplying power at a first voltage level; a second power line for supplying power at a second voltage level; a first fuse that blows when an overcurrent flows in the first power line; a second fuse that blows when an over-current flows in the second power line; a first detection line that is set to the ON state by the blowing of the first fuse; a second detection line that is set to the ON state by the blowing of the second fuse; and a report line that is employed to carry a notice to the information processing apparatus when at least one of the first and the second detection lines is set in the ON state.

According to a fourth aspect of the present invention, an input/output device controller, which permits an information processing apparatus to communicate with a detachable input/output device, comprises: an interface that is employed for data exchange with an input/output bus of the information processing apparatus; a register for temporarily holding part of a data group that is to be exchanged; a driver for transmitting a signal to the input/output device; a power enabler for connecting and disconnecting a power line that joins the input/output device to a power source in accordance with data that are written into the register; and a detection means for detecting an over-current in the power line and for turning off the driver in response to the detection result that is obtained by the detection means.

According to a fifth aspect of the present invention, an input/output device controller, which permits an information processing apparatus to communicate with a detachable input/output device, comprises: an interface that is employed for data exchange with an input/output bus of the information processing apparatus; a register for temporarily holding part of a data group that is to be exchanged; a driver for transmitting a signal to the input/output device; a power enabler for connecting and disconnecting a power line that joins the input/output device to a power source in accordance with the contents written in the register; detection means for detecting an over-current in the power line and for providing, in the register, a field in which the detection result is written and for turning off the driver in response to the detection result that is obtained by the detection means.

According to a sixth aspect of the present invention, a power enabling method, for controlling supply of power from an information processing apparatus to a detachable input/output device, comprises the steps of: detecting whether or not there exists a supplied power abnormality; and halting transmission of a signal to the input/output device in response to the abnormality that is detected.

According to a seventh aspect of the present invention, a power enabling method, for controlling supply of power from an information processing apparatus to a detachable input/output device, comprises the steps of: detecting whether or not there exists a supplied power abnormality; halting the supply of power in response to detection of the abnormality; halting transmission of a signal to the input/output device in response to the detection of the abnormality; and reporting the detection of the abnormality to the information processing apparatus.

According to an eighth aspect of the present invention, a power enabling method, for controlling supply of power from an information processing apparatus to a detachable input/output device, comprises the steps of: initiating the supply of power in response to the loading of the input/output device into the information processing apparatus; detecting whether or not there exists a supplied power abnormality; halting the supply of power in response to detection of the abnormality; halting transmission of a signal to the input/output device in response to the detection of the abnormality; reporting the detection of the abnormality to the information processing apparatus; and maintaining the halting of the supply of power to the input/output device at least while the input/output device is loaded.

According to a ninth aspect of the present invention, a power enabling mechanism, which controls supply of power from an information processing apparatus to a detachable input/output device, comprises: a first power line for supplying power at a first voltage level; a second power line for supplying power at a second voltage level; a first detector for detecting an over-current in the first power line; a second detector for detecting an over-current in the second power line; OR gate means for logically adding the outputs of the first and the second detectors; a first switch that is employed for connection and disconnection of the first power line; first ON/OFF control means for turning on the first switch in accordance with an instruction from the information processing apparatus and for turning off the first switch in response to the logical sum that is acquired by the OR gate means and for maintaining an OFF state until an instruction is received from the information processing apparatus; a second switch that is employed for connection and disconnection of the second power line; and second ON/OFF control means for turning on the second switch according to an instruction from the information processing apparatus and for turning off the second switch in response to the logical sum that is acquired by the OR gate means and for maintaining an OFF state until an instruction is received from the information processing apparatus.

According to a tenth aspect of the present invention, a power enabling mechanism, which controls supply of power from an information processing apparatus to a detachable input/output device, comprises: a first power line for supplying power at a first voltage level; a second power line for supplying power at a second voltage level; a first detector for detecting an over-current in the first power line; a second detector for detecting an over-current in the second power line; OR gate means for logically adding the outputs of the first and the second detectors; a first switch that is employed for connection and disconnection of the first power line; first ON/OFF control means for turning on the first switch according to an instruction from the information processing apparatus and for turning off the first switch in response to the logical sum that is acquired by the OR gate means, and for maintaining an OFF state until an instruction is received from the information processing apparatus; a second switch employed for connection and disconnection of the second power line; second ON/OFF control means for turning on the second switch according to an instruction from the information processing apparatus and for turning off the second switch in response to the logical sum that is acquired by the OR gate means and for maintaining an OFF state until an instruction is received from the information processing apparatus and which also employs the OR gate means to report the output to the information processing apparatus.

According to an eleventh aspect of the present invention, an input/output device controller, which permits an information processing apparatus to communicate with a detachable input/output device, comprises: an interface that is employed for data exchange with an input/output bus of the information processing apparatus; a register for temporarily holding part of a data group that is to be exchanged; a driver for transmitting a signal to the input/output device; a power enabler for connecting and disconnecting a power line that joins the input/output device to a power source in accordance with the contents written in the register; detection means for detecting an over-current in the power line; holding means for holding a detection result until an instruction is received from the information processing apparatus; and means for turning off the driver in response to an output of the holding means.

According to a twelfth aspect of the present invention, an input/output device controller, which permits an information processing apparatus to communicate with a detachable input/output device, comprises: an interface that is employed for data exchange with an input/output bus of the information processing apparatus; a register for temporarily holding part of a data group that is to be exchanged; a driver for transmitting a signal to the input/output device; a power enabler for connecting and disconnecting a power line that connects the input/output device to a power source in accordance with the contents written in the register; detection means for detecting an over-current in the power line; holding means for holding detection result until an instruction is received from the information processing apparatus; and means for turning off the driver in response to an output of the holding means based on the contents of the register field in which the detection result is written.

According to the first, second, ninth, and tenth aspects of the present invention, a circuit (e.g., a combination of a resistor that converts a current into a voltage and an amplifier that detects a voltage level) for detecting an over-current is provided for individual power lines, and the connection and disconnection of the power lines are performed in accordance with the output of the detection circuit. As soon as a PC card that has a power abnormality (e.g., a large power consumption or a short-circuiting of an internal circuit to the GND) is loaded, the supply of power can be shut down immediately, thus preventing the system of the PC from being shut down and avoiding the destruction of the contents of its main memory. Since fuses are not employed for the disconnection of the power lines, replacement or repair of the devices is not required at all. When a user loads a PC card into other slots, one after another, to try to determine what is wrong, the damage that is caused by a conventional card will not occur.

According to the third aspect of the present invention, although fuses are employed to cut off the power to the PC card because the blowing of the fuses can be reported to the PC, the damage due to the fault can be minimized.

According to the first, second, third, ninth and tenth aspects of the present invention, even when, among the two system power lines for $V_{CC}$ and $V_{PP}$ that are specified by PCMCIA, only the power line for the reference voltage $V_{CC}$ is cut off, the power line for $V_{PP}$ can also be cut off, and the undesired destruction of the PC card can be prevented.

According to the second, third, fifth, seventh, eighth, tenth and twelfth aspects of the present invention, when an abnormality is detected in the supply of power to the PC card, the detection result can be reported to the PC. Therefore, as the result can also be reported to a user via a GUI (Graphical User Interface), etc., no unnecessary effort to confirm an abnormality is required.

According to the fourth, fifth, sixth, seventh, eighth, eleventh and twelfth aspects of the present invention, when an abnormality is detected in the supply of power to the PC card, the output of the driver for transmitting a signal (an address signal, data signal, or a control signal) to the PC card is halted, and the destruction of the internal circuit of the PC card due to the latch-up, etc., can be prevented.

According to the eighth, ninth, tenth, eleventh and twelfth aspects of the present invention, when a PC card that has a power supply abnormality is loaded into a card slot, the power line cut-off and/or the output halt of a bus signal to the PC card can be maintained. Therefore, even when a PC card that has an abnormality is being loaded, ringing of a supplied current that accompanies the repetitious connection and disconnection of the power lines to the power source can be prevented.

Other objects, the features, and the advantages of the present invention will become apparent during the following detailed explanation, of the embodiments of the present invention, that is presented while referring to the accompanying drawings.

DESCRIPTION OF THE FIGURES

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE PREFERRED EMBODIMENTS

The embodiments of the present invention will be described in the following articles:

A. Hardware arrangement of a first embodiment
B. Hardware arrangement of a second embodiment
C. System structure of a PC used in conjunction with the present invention
D. Operation of a PC that implements the present invention.

A. Hardware Arrangement of a First Embodiment

Figure 1:
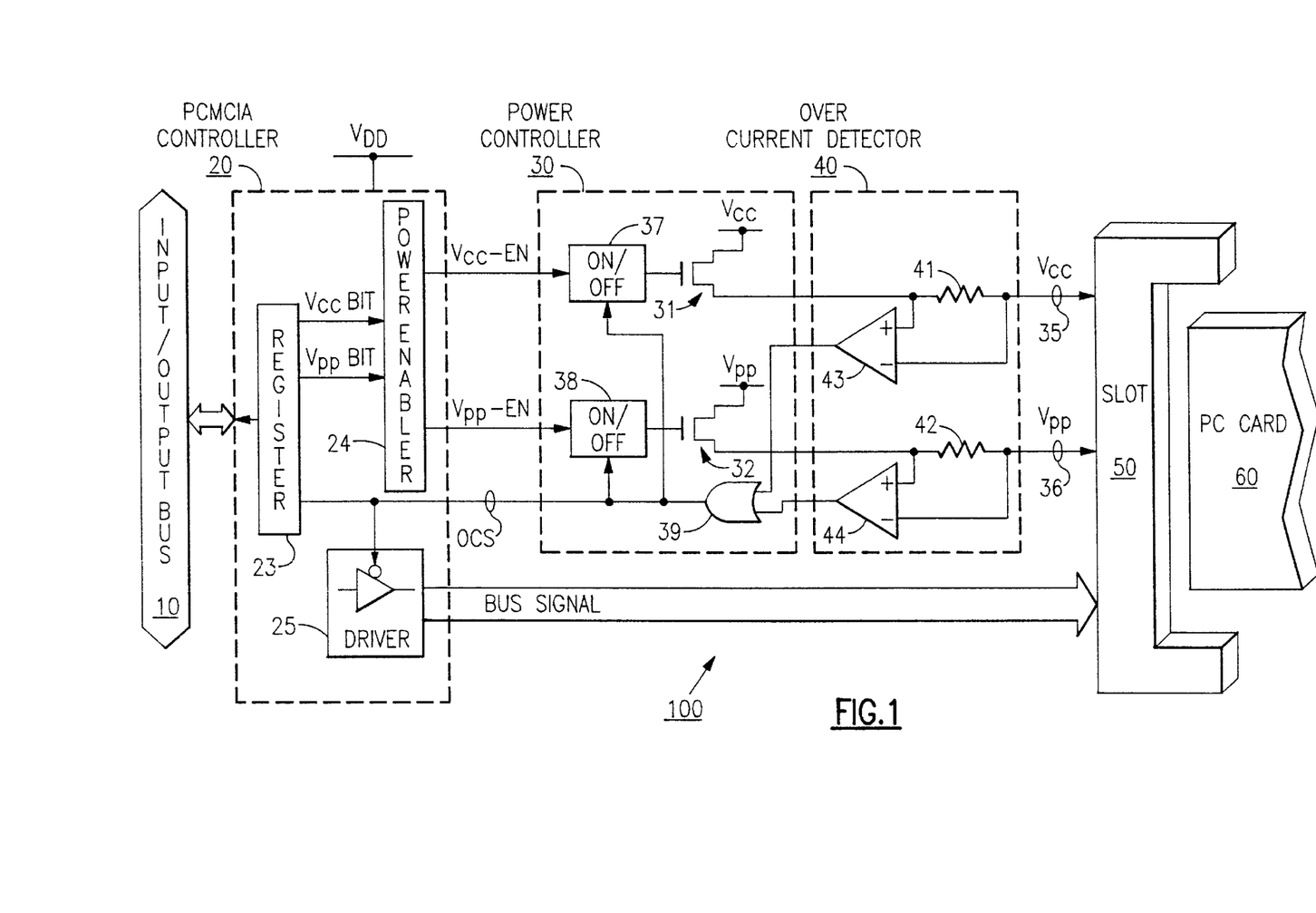
FIG. 1 is a schematic diagram illustrating the hardware arrangement associated with a PCMCIA PC card slot according to a first embodiment of the present invention.

FIG. 1 is a schematic diagram illustrating the hardware arrangement 100 associated with a PCMCIA (PC card) slot according to a first embodiment of the present invention. In FIG. 1, the same reference numbers as are used in FIG. 11 are used to denote corresponding or identical components, and sections that are unnecessary to the explanation are not described. There are three major differences between the first embodiment and the prior art shown in FIG. 11. These differences will now be described in detail.

The first difference between the first embodiment and the prior art shown in FIG. 11 is that over-current detector 40 is provided instead of fuses 33 and 34 on power lines 35 and 36. Over-current detector 40 detects over-currents that flow in the power lines 35 and 36.

As is shown in FIG. 1, resistor 41, which converts a current into a voltage, is inserted in series on power line 35. The two ends of resistor 41 are connected respectively to the non-inversion terminal and the inversion terminal of differential amplifier 43. Differential amplifier 43 has its threshold value set at a voltage level that corresponds to an over-current value that is to be detected. When an over-current flows in power line 35, differential amplifier 43 is turned on. Similarly, resistor 42 is connected in series on power line 36, and a difference in the potentials at the two ends of resistor 42 is detected by differential amplifier 44. Since over-current detector 40 constitutes an analog device, the response is quick, and as soon as a PC card with a power abnormality or which produces a large power consumption is loaded into slot 50, power lines 35 and 36 can be cut off from voltages $V_{CC}$ and $V_{PP}$.

The second difference between this embodiment and the prior art is that the two detection results by the above-described over-current detector 40 are fed back to power controller 30.

As is shown in FIG. 1, the output signals from differential amplifiers 43 and 44 are supplied to OR gate 39 (disjunctive circuit means). OR gate 39, which is a component for outputting a logical sum of these two inputs, forwards output signal OCS (Over Current Signal) in response to the detection of an over-current in at least one of power lines 35 and 36. The output OCS signal from OR gate 39 is sent to ON/OFF switch controllers 37 and 38. ON/OFF switch controller 37 receives not only the output signal OCS from OR gate 39, but also receives a control signal $V_{CC}$_En from power enabler 24 of PCMCIA controller 20, and forwards a logical product of the low-level OCS (i.e., the over-current undetected state) and the high-level $V_{CC}$_En (i.e., the enabled state of the power line 35) to the gate of semiconductor switch 31. ON/OFF switch controller 38 receives not only the output OCS signal from OR gate 39, but also receives control signal $V_{PP}$_En from power enabler 24 of PCMCIA controller 20, and supplies a logical product of the low-level OCS (i.e., the over-current undetected state) and the high-level $V_{PP}$_En (i.e., the enabled state of the power line 36) to the gate of semiconductor switch 32. Switches 31 and 32 are preferably P-channel MOSFET switches. When the outputs of ON/OFF switch controllers 37 and 38 are high, i.e., when power lines 35 and 36 are in the enabled state and an over-current is not detected yet, power lines 35 and 36 are connected to the respective power sources $V_{CC}$ and $V_{PP}$. They are cut off in response to the detection of an over-current. The cutoff of power in lines 35 and 36 is performed as a normal operation of transistors 31 and 32 instead of by the destruction of components, such as fuses. Therefore, the replacement of such components as fuses, as is described in the "Background of the Invention", is not required. Operation of the PC card slot is restarted by inserting a normal PC card.

Figure 2:
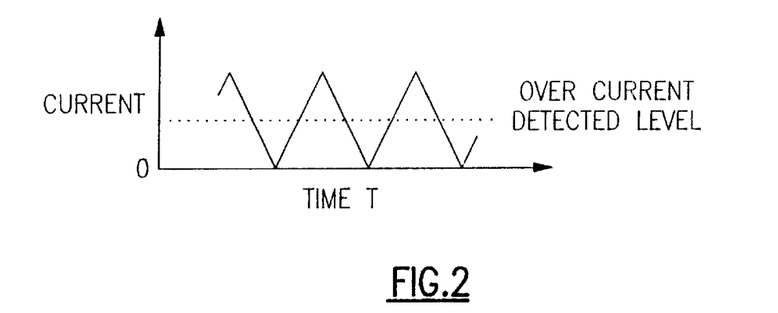
FIG. 2 is a graph showing a current that flows in certain power lines when an over-current detection result is not maintained.

Although, for the purpose of providing a simplified explanation, ON/OFF switch controllers 37 and 38 have been employed simply as a combination circuit, such as an AND gate, it is preferable that controllers 37 and 38 act as a sequential circuit that can latch the internal state. More specifically, it is desirable that, once an over-current is detected, the OFF states of switches 31 and 32 can be maintained at least until being reset by the insertion of another PC card. Since an over-current is not detected by cutting off switches 31 and 32, the closing and the opening of switches 31 and 32 may be endlessly repeated if the over-current detection result cannot be latched. As a result, a ringing current (a triangular wave current that has as its main amplitude a threshold value of the differential amplifiers 43 and 44), as is shown in FIG. 2, may flow in power lines 35 and 36 (a ringing current will probably cause thermal destruction of PC card 60 and slot 50 and is a waste of power for the PC).

Figure 3:
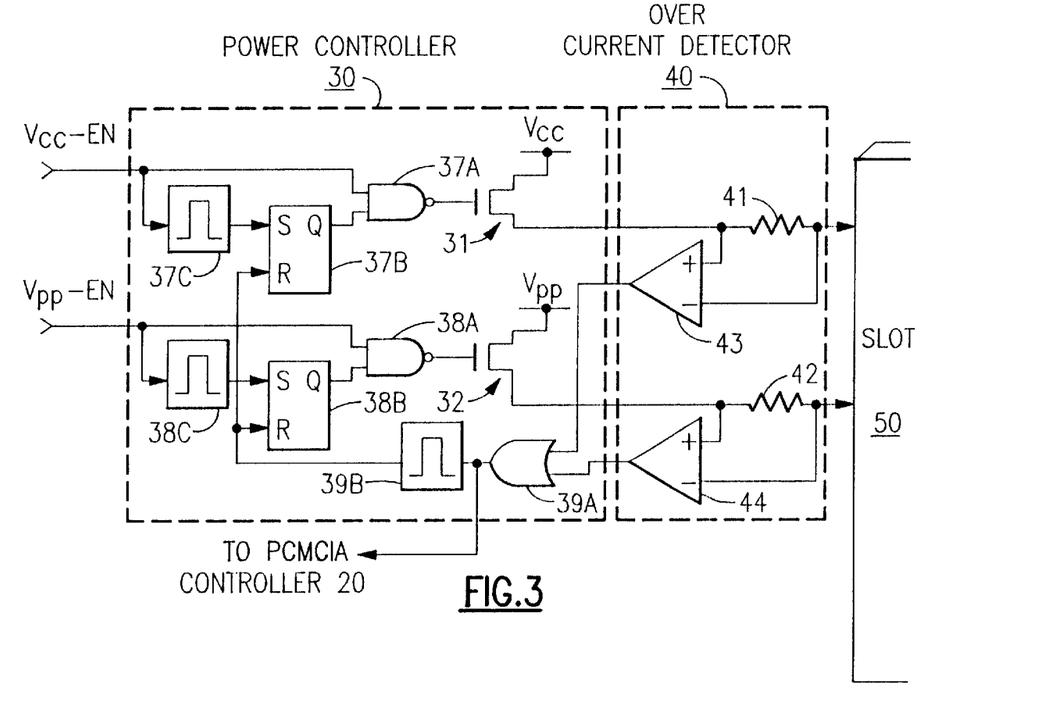
FIG. 3 is a diagram showing the detailed structure of a power controller according to a first embodiment of the present invention, and more specifically, is a diagram showing the internal structure of a power controller that can maintain the cut-off states of the power lines to the PC card slot.

FIG. 3 is a detailed diagram of the internal structure of power controller 30 that can latch the over-current detection result. In FIG. 3, ON/OFF switch controller 37 includes NAND gate 37A, SR (set reset) latch 37B, and pulse generator 37C. ON/OFF switch controller 38 includes NAND gate 38A, SR latch 38B, and pulse generator 38C. Since the structures and the processing of ON/OFF switch controllers 37 and 38 are almost identical, an explanation will be given only for ON/OFF switch controller 37.

Signal $V_{CC}$_En from power enabler 24 is directly input to one terminal of NAND gate 37A, and is also input to the S terminal of SR latch 37B via pulse generator 37C. The output Q of SR latch 37B is input to the other terminal of NAND gate 37A. NAND gate 37A inverts the logical product of the two inputs and supplies output as a result to the gate of switch 31. Pulse generator 37C outputs one pulse each time an input signal goes high, and upon the receipt of one pulse at the S terminal, SR latch 37B sets the Q output high. When the $V_{CC}$_En signal is enabled, both inputs to NAND gate 37A are high, and switch 31 is turned on. Over-current detection results for power lines 35 and 36 are sent to OR gate 39A, and then to the R terminal of SR latch 37B via pulse generator 39B. Upon the receipt of one pulse at the R terminal, SR latch 37B resets the Q output. Therefore, when an over-current is detected for at least one of power lines 35 and 36, pulse generator 39B outputs one pulse, and the Q output of SR latch 37B is set to low. When signal $V_{CC}$_En is enabled, the output of NAND gate 37A is set to high. As a result, P-channel MOSFET switch 31 is turned off and maintained in the OFF state.

Figure 4:
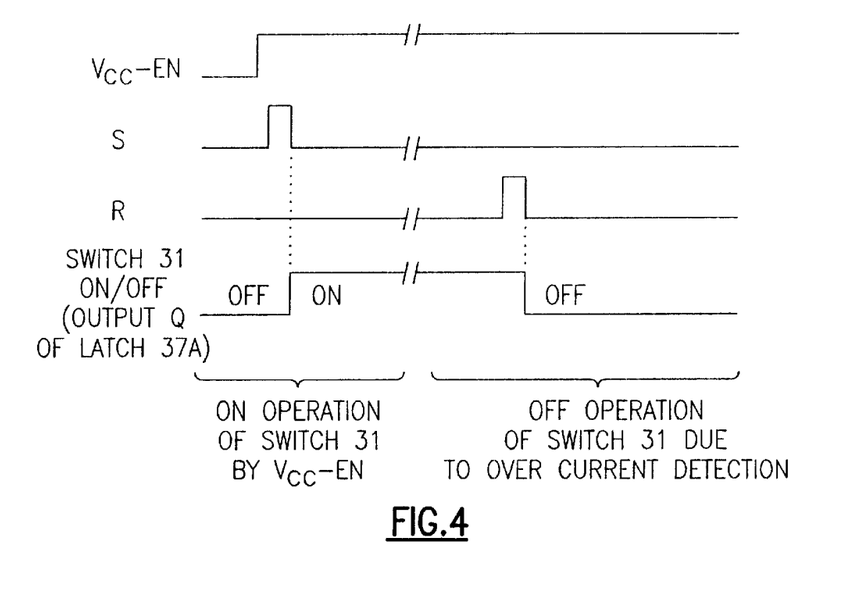
FIG. 4 is a timing chart for the ON/OFF operation of a switch when the power controller shown in FIG. 3 is employed.

FIG. 4 is a timing chart for the ON/OFF operation of switch 31 when power controller 30 (shown in FIG. 3) is employed. As is shown in FIG. 4, in response to the enabled state of $V_{CC}$_En, one pulse is input to the S terminal and SR latch 37B is set. As a result, switch 31 is also turned on. When an over-current is detected, one pulse is input to the R terminal, and SR latch 37B is reset. As a result, switch 31 is also turned off. It would be understood by one having ordinary skill in the art that once an over-current is detected, switch 31 is maintained in the OFF state even when $V_{CC\_En}$ is enabled.

The third major difference between the first embodiment and the prior art is that the two outputs of over-current detector 40 are fed back to PCMCIA controller 20. More specifically, the output of OR gate 39 is individually sent to driver 25 and register 23.

Figure 5:
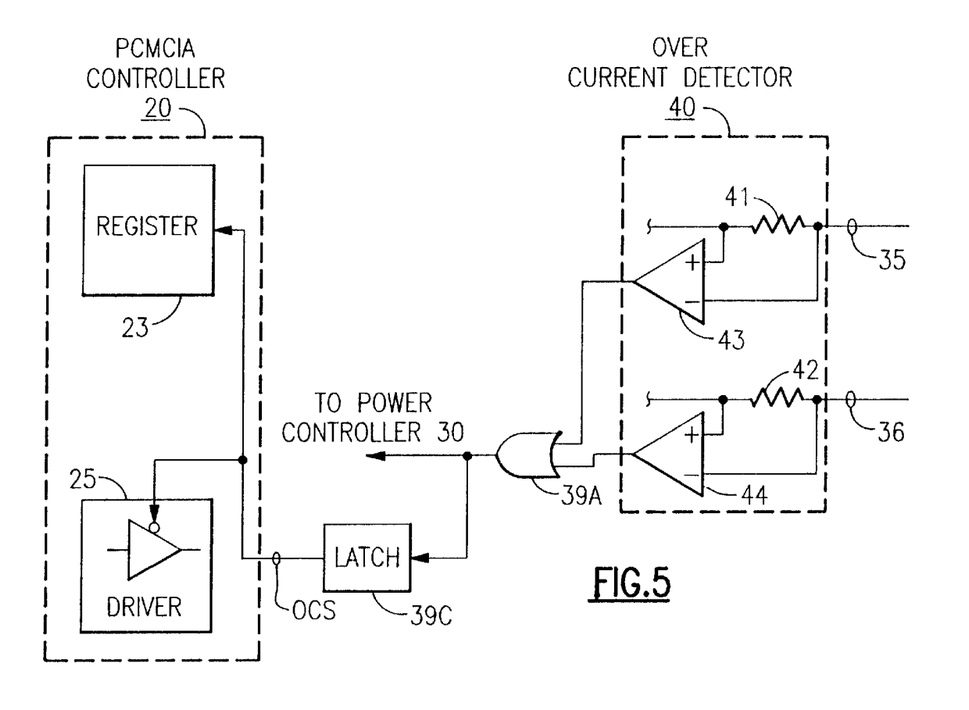
FIG. 5 is a diagram showing the internal arrangement of a PCMCIA controller according to a first embodiment of the present invention.

FIG. 5 is a diagram showing only the relevant internal structure of PCMCIA controller 20, which is required for an understanding of the first embodiment of the present invention. As is shown in FIG. 5, the output of OR gate 39A, which is the over-current detection result for power line 35 or 36, is also supplied to latch 39C. Latch 39C is a sequential circuit that maintains its output (OCS) high when a high output is received from OR gate 39A, and is implemented by a D (data) latch, for example. The output of latch 39C is forwarded to register 23 and driver 25. Upon the receipt of the high level signal OCS, register 23 stores an OCS indication bit at a predetermined address (location), which is more particularly described below. Driver 25, which is an equivalent circuit to a buffer for transmitting power, receives the inverted OCS signal at a gate control terminal of the buffer. Therefore, in response to the high OCS signal that is accompanied by the over-current detection, driver 25 is placed into a high impedance state (Hi-Z), and as a result, the transmission of a bus signal to PC card 60 is halted.

Figure 6:
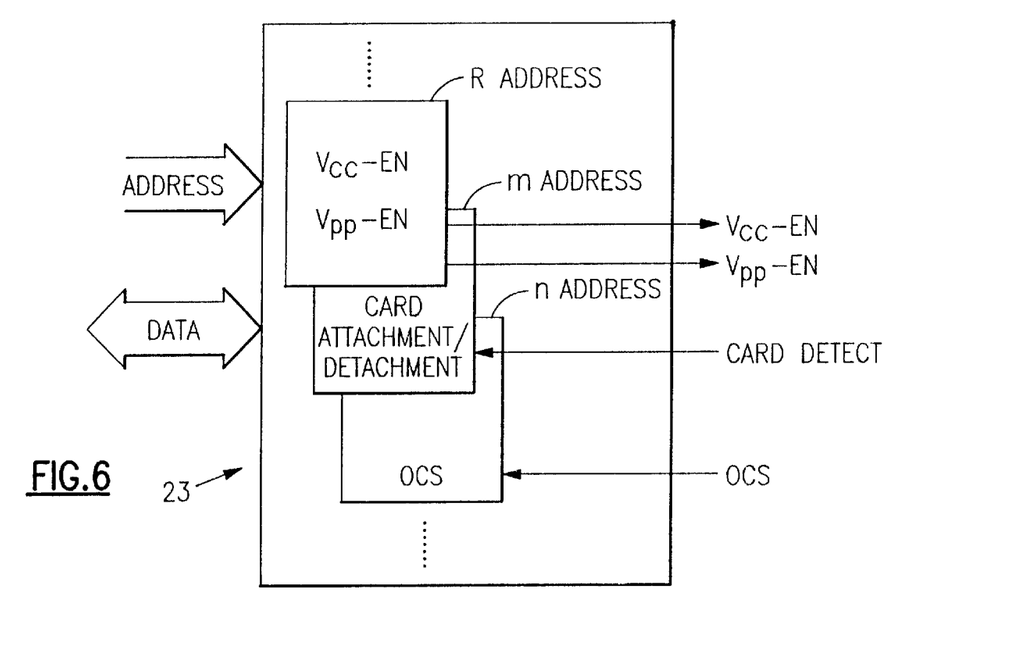
FIG. 6 is a diagram illustrating the structure of a register in a PCMCIA controller according to a first embodiment of the present invention.

FIG. 6 is a diagram showing a part of the internal structure of register 23 of PCMCIA controller 20. In FIG. 6, an address, generically referred to as "R", points to an input register in which a $V_{CC}$ bit, a $V_{PP}$ bit are stored; these provide instruction for supplying power to power lines 35 and 36. Address m points to an output register in which an event indicator (Card Detect) for the loading of the PC card 60 to the slot 50 is stored. Address n points to an output register in which an event indicator (OCS bit) for the detection of an over-current situation is stored, and to which a detection signal OCS is input (as previously described). Register 23 is generally described by referring to Intel Part No. 182365SL. The output register in which the contents of the OCS bit are written is unique to this embodiment. Since the PC can access register 23 during a normal I/O read cycle, a PC card power abnormality can be found by reading data at address n. Although register 23 includes many other I/O registers, they are well known to those having ordinary skill in the art, and no explanation for them is necessary to understand the present invention.

B. Hardware Arrangement of a Second Embodiment

Figure 7:
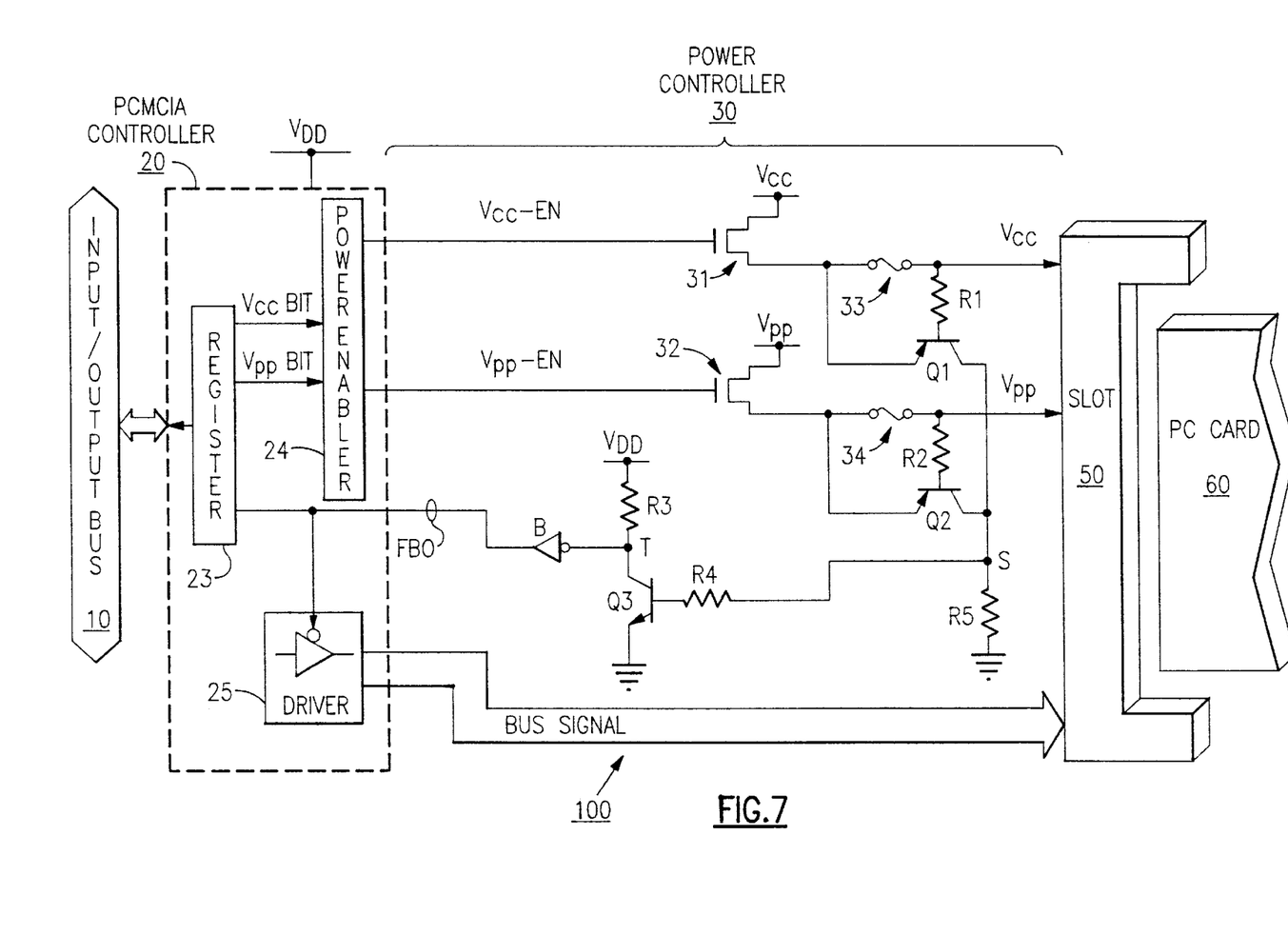
FIG. 7 is a schematic diagram illustrating the hardware circuit associated with a PCMCIA PC card slot according to a second embodiment of the present invention.

FIG. 7 is a schematic diagram illustrating the hardware arrangement 100 associated with a PCMCIA PC card slot according to a second embodiment of the present invention. In FIG. 7, the same reference numbers as are used in FIG. 11 are used to denote corresponding or identical components. Sections that are not required for the explanation are not shown in FIG. 7.

In the second embodiment, instead of over-current detector 40, fuses 31 and 32 are employed as in the prior art (FIG. 11) to cut off power at power lines 35 and 36. It should be noted that this embodiment differs from the prior art in that the power cutoff by fuses 31 and 32 is fed back to PCMCIA controller 20.

In FIG. 7, the emitter of pnp transistor Q1 is connected to the power $V_{CC}$ side terminal of fuse 33, and its base is connected to PC card 60 side terminal of fuse 33 via resistor $R_1$. Since the base and the emitter have the same electric potential while fuse 33 is intact, transistor Q1 is turned off. When an over-current flows in power line 35 and fuse 33 blows, the base is pulled down to GND potential with PC card 60 as a load, and bias voltage $V_{CC}$ is applied to the emitter of Q1. Transistor Q1 is thus turned on and is maintained in this state.

The emitter of transistor Q2, which is also preferably a pnp transistor, is connected to $V_{PP}$ voltage side terminal of fuse 34 and its base is connected to PC card 60 side terminal of fuse 34 via resistor $R_2$. Although transistor Q2 is turned off when fuse 34 is intact, once fuse 34 blows, transistor Q2 is turned on and is maintained in this state.

The collector terminals of transistors Q1 and Q2 are OR-coupled at point S and are then branched. One end is connected to the base of npn transistor Q3 through resistor $R_4$, and the other end is pulled down to GND potential via resistor $R_5$. The emitter of the transistor Q3 is pulled down to the GND, and system voltage $V_{DD}$ is then present at the collector of transistor Q3 via resistor $R_3$. Since the base potential is maintained as a GND level as long as a normal current flows in power lines 35 and 36 and transistors Q1 and Q2 are turned off, transistor Q3 is also turned off and the voltage at point T is kept high. When an over-current flows in at least one of power lines 35 and 36, either transistor Q1 or Q2, or both, are turned on, and in response to this, a current flows to the base of transistor Q3. Thus, transistor Q3 is turned on and is maintained in the ON state. Furthermore, a current flows from the collector of transistor Q3 to its emitter and the voltage at point T drops.

The collector terminal of transistor Q3 branches at point T. A signal, FBO (Fuse Blow Out), which reports the blowing of fuses 33 or 34, is carried over one of the branched signal lines through inverter B. The FBO signal is transmitted to address n of register 23 and to the gate control terminal of driver 25 in PCMCIA controller 20. When both fuses 33 and 34 are intact, the FBO, which is the inversion signal for the collector voltage of transistor Q3, is maintained low. When at least one of fuses 33 and 34 has blown, the FBO signal goes high and is maintained high. Since thereafter a high potential voltage is applied to the gate control terminal of driver 25, and since driver 25 thus goes into a high impedance state, a bus signal to slot 50 cannot be output. In response to the high-level FBO signal, an OCS bit indicating that the power is cut off is set at address n in register 23. The structures and the operational characteristics of register 23 and driver 25 are the same as those in the first embodiment.

Since the high-level FBO signal is maintained by the blowing of fuses 33 or 34, latch 39C shown in FIG. 5 is not necessary. Resistors $R_1$, $R_2$, $R_3$, $R_4$, and $R_5$ are components for voltage to current conversion and for current to voltage reconversion and are preferably approximately 1 kΩ to 10 kΩ.

C. System Structure of a PC Used in Conjunction with the Present Invention

Figure 8:
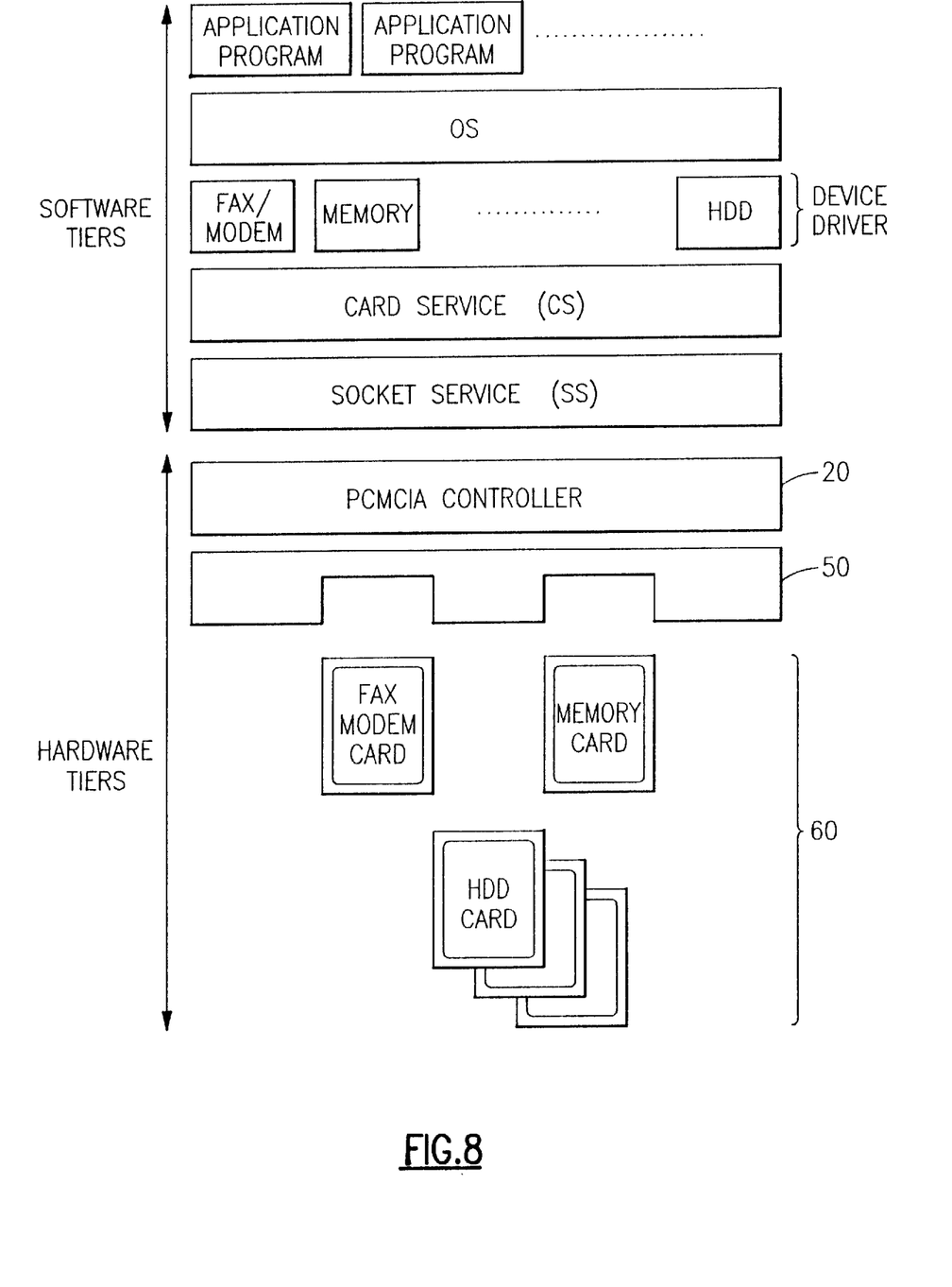
FIG. 8 is a diagram showing the system structure of a personal computer (PC) used in conjunction with the present invention.

FIG. 8 is a schematic diagram illustrating the system structure of a PC that employs a PCMCIA PC card slot according to the first and the second embodiments of the present invention.

The lower tiers shown are hardware tiers and their details are as described above in section A or B. For PC card 60, besides memory card specifications, there are I/O card specifications, such as those for a fax/modem card, a LAN adaptor card, an HDD card, and an IR (infrared communication) adaptor card. The PC includes one or more slots into which a PC card is loaded.

The upper tiers shown are preferably implemented in software. The lowest level of the software tier is a socket service (SS). The socket service is PC card control software that includes a function call for directly accessing PCMCIA controller 20 for performance control. More specifically, the socket service has functions such as the acquisition of the state of PC card slot 50, the resetting of an interrupt level when the state of slot 50 is changed, and the mapping of the memory and the I/O port of PC card 60 to the PC.

A card service (CS), which is PC card control software that is located between the socket service and upper system software, can issue a function call to the socket service. More specifically, the card service has a table for the hardware resources (e.g., memory space and I/O space that a PC card uses, and an interrupt level) that are assigned to each PC card. In response to the attachment and detachment of a PC card, the hardware resources can be actively re-distributed, and the PC card attachment and detachment events can be reported to a corresponding device drive or to a corresponding application program.

In the hardware tiers, data are exchanged between individual hardware components of the system; and ordinary commands that are issued by the software tier are changed to operable code by the hardware and are subsequently transmitted to the hardware tier. Device drivers for operating a fax/modem card, a LAN adaptor card, a HDD (hard disk drive) card, and a serial IR (InfraRed communication) adaptor card are the counterparts to these hardware components. The device drivers can issue a function call to the card service for the assignment of hardware resources.

An operating system (OS) is the basic software for controlling the execution of the application programs at the highest tier level. More specifically, the operating system performs resource management, such as a command processing, memory control, input/output control, and task management, to enable a PC to execute application programs. The operating system also provides an interface environment for users, such as a system command or a system call. OS/2 (U.S. IBM trademark) and AIX (U.S. IBM trademark) are the examples of operating systems. The OS is sometimes equipped with standard device drivers, card services, and configuration software.

At the highest tier level are application programs, which are loaded by a user from an auxiliary storage device into a main memory. Since these are not associated with the subject of the present invention, a detailed explanation of them is not given.

D. Operation of a PC that Implements the Present Invention

Having described above the hardware and software arrangements of the system for implementing the present invention, the operation of the system and the processing of the present invention is now explained in this section.

Figure 9:
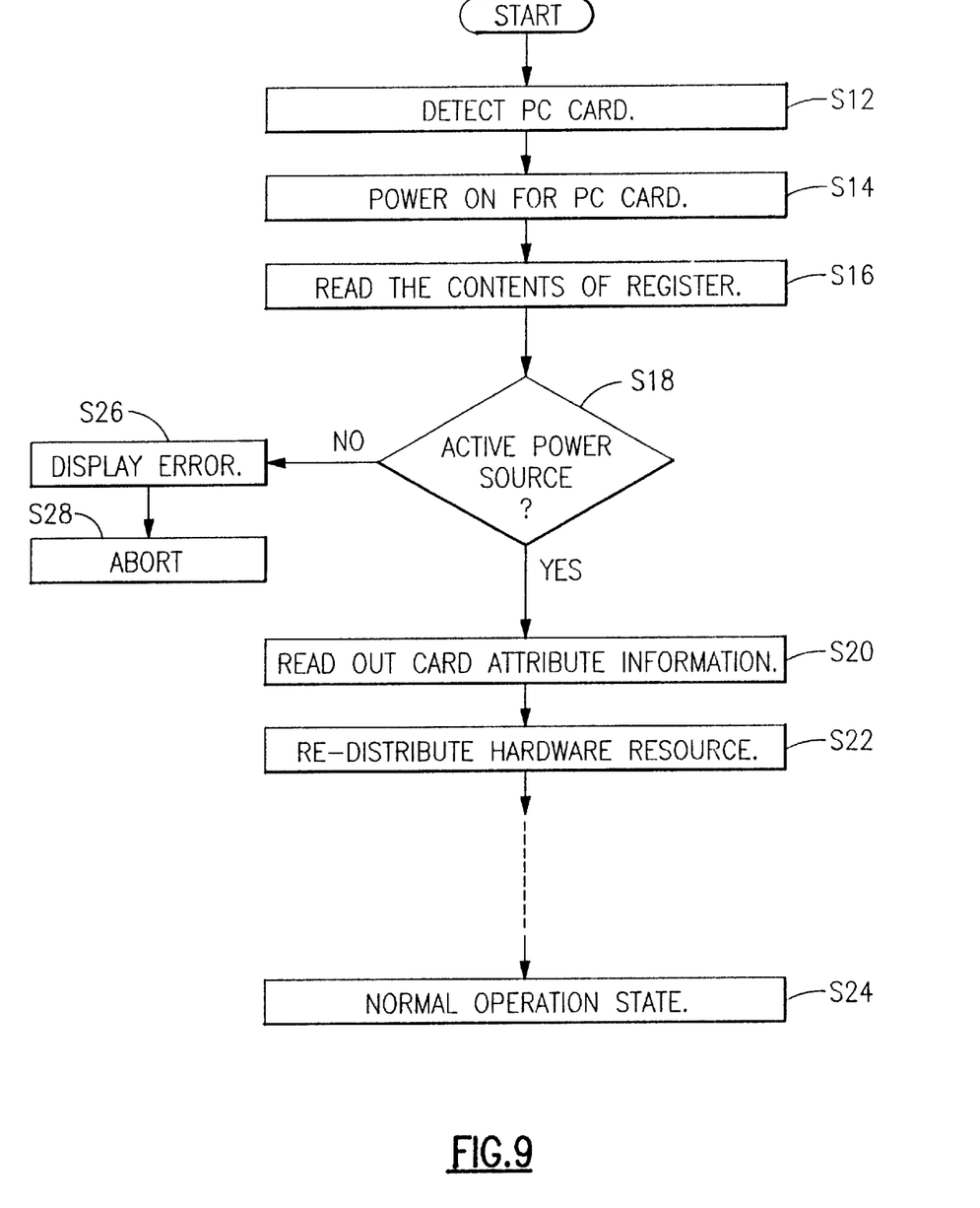
FIG. 9 is a flowchart for the operation of the PC that is used in conjunction with the present invention.

FIG. 9 is a flowchart for system operation when PC card 60 is loaded into a PC that implements the present invention. The procedures at the individual steps are now described in detail.

When PC card 60 is inserted into slot 50, the socket service (SS) detects and reports this action, via the card service, to the device driver (step S12).

Then, the PC (more specifically, the device driver) tries to "power on" PC card 60 by writing the $V_{CC}$ bit and the $V_{PP}$ bit at address k of the register 23 (step S14). When an over-current in at least one of power lines 35 and 36 is detected, or when one of the fuses has blown, the OCS bit is set in register 23 (as previously described). The socket service (SS) reads the contents at address n into register 23 during the I/O read cycle (step S16). Then, a check is performed to determine whether or not the supply of power to power lines 35 and 36 is normal (step S18).

If the decision at step S18 is affirmative, upon a request from the configuration software of the device driver, the socket service (SS) reads attribute information for PC card 60 (card information structure: CIS) (step S20). Then, the card service employs the CIS and actively re-distributes the PC hardware resources, by assigning to PC card 60 memory space and I/O space in the PC, and an interrupt level (step S22). Then, the PC is placed in its normal operational state (step S24). The CIS comprises PC card identification information, access speed, electric specifications, and configuration. CIS information is stored in, for example, a ROM that is incorporated in PC card 60.

When the decision at step S18 is negative, that is, when the OCS bit is set at address n in register 23, it is reported as error information to the OS via the socket service and the card service. The OS may report the contents of the error to a user via a GUI (Graphical User Interface) (step S26). Since the notice is reported to a user via the GUI, reoccurrence of a fault, such as insertion of PC card 60 into other slots, can be prevented. The insertion of PC card 60 is abnormally terminated (aborted), and later access to PC card 60 may be inhibited (step S28).

The present invention has been explained in detail while referring to the specific embodiment. It will be obvious, however, to one having ordinary skill in the art that the above embodiment may be modified or varied without exceeding the scope and the spirit of the present invention. While the present invention has been disclosed by using an example, it is not limited to this example. To understand the subject of the present invention, claims should be referred to.

As described above in detail, according to the present invention, it is possible to provide a power enabling mechanism, a power enabling method, and an input/output device controller for securely supplying power to a PC card that is loaded into a slot of a personal computer (PC), and for preventing a voltage reduction and circuit fault of the PC and the latch-up of the PC card even when power consumption by the PC card is abnormal (that is, when power consumption exceeds specified standards).

More specifically, according to the present invention, even when, among the two system power lines for $V_{CC}$ and $V_{PP}$ that are specified by PCMCIA, only the power line for the reference voltage $V_{CC}$ is cut off, the power line for $V_{PP}$ can also be cut off, and the undesired destruction of the PC card can be prevented.

Furthermore, according to the present invention, when an abnormality is detected in the supply of power to the PC card, the detection result can be reported to the PC. Therefore, since the result can also be reported to a user via a GUI (Graphical User Interface), etc., no unnecessary effort to confirm an abnormality is required.

In addition, according to the present invention, when an abnormality is detected in the supply of power to the PC card, the output of the driver for transmitting a signal (an address signal, data signal, or a control signal) to the PC card is halted, and the destruction of the internal circuit of the PC card due to the latch-up, etc., is prevented.

Moreover, according to the present invention, when a PC card that has a power supply abnormality is loaded into a card slot, the power line cut-off and/or the output halt of a bus signal to the PC card can be maintained. Therefore, even when a PC card that has an abnormality is being loaded, ringing of a supplied current that accompanies the repetitious connection and disconnection of the power lines to the power source can be prevented.

The invention claimed is:

1. A power enabling mechanism, which controls supply of operating power from an information processing apparatus to a detachable input/output device, said mechanism comprising:
   a first power line for supplying power at a first voltage level to said input/output device;
   a second power line for supplying power at a second voltage level to said input/output device;
   a first detector for detecting an over-current in said first power line;
   a second detector for detecting an over-current in said second power line;
   disjunctive circuit means for logically adding the outputs of both said first and second detectors;
   a first switch that is employed for connection and disconnection of said first power line in response to an output of said disjunctive circuit means; and
   a second switch that is employed for connection and disconnection of said second power line in response to an output of said disjunctive circuit means.

2. A power enabling mechanism, which controls supply of operating power from an information processing apparatus to a detachable input/output device, said mechanism comprising:
   a first power line for supplying power at a first voltage level;
   a second power line for supplying power at a second voltage level;
   a first detector for detecting an over-current in said first power line;
   a second detector for detecting an over-current in said second power line;
   disjunctive circuit means for logically adding the outputs of both said first and second detectors;
   a first switch that is employed for connection and disconnection of said first power line in response to an output of said disjunctive circuit means;
   a second switch that is employed for connection and disconnection of said second power line in response to an output of said disjunctive means; and
   means for supplying output from said disjunctive circuit to said information processing apparatus.

3. The power enabling mechanism according to claim 1, wherein said first and said second switches are selected from the group consisting of MOSFET transistors and bipolar transistors.

4. A power enabling mechanism, which controls supply of operating power from an information processing apparatus to a detachable input/output device, said mechanism comprising:
   a first power line for supplying power at a first voltage level;
   a second power line for supplying power at a second voltage level;
   a first fuse that blows when an over-current flows in said first power line;
   a second fuse that blows when an over-current flows in said second power line;
   a first detection means having an output that is set to the ON state by the blowing of said first fuse;
   a second detection means having an output that is set to the ON state by the blowing of said second fuse; and
   a report signal line that is employed to carry a notice to said information processing apparatus that at least one of said first and said second detection lines is set in the ON state.

5. The power enabling mechanism according to claim 4, wherein said detachable input/output device is a PC card that conforms to standards specified by PCMCIA/JEIDA.

6. An input/output device controller, which permits an information processing apparatus to communicate with a detachable input/output device, said controller comprising:
   an interface that is employed for data exchange with an input/output bus of said information processing apparatus;
   a register for temporarily holding part of a data group that is to be exchanged;
   a driver for transmitting a signal to said input/output device;
   a power enabler for connecting and disconnecting a power line that joins said input/output device to a power source for operating said device in accordance with data stored in said register;
   detection means for detecting an over-current in said power line; and
   means for turning off said driver in response to said detection result obtained from said detection means.

7. An input/output device controller, which permits an information processing apparatus to communicate with a detachable input/output device, said controller comprising:
   an interface that is employed for data exchange with an input/output bus of said information processing apparatus;
   a register for temporarily holding part of a data group that is to be exchanged;
   a driver for transmitting a signal to said input/output device;
   a power enabler for connecting and disconnecting a power line that joins said input/output device to a power source for operating said device in accordance with data stored in said register;
   detection means for detecting an over-current in said power line;
   means for storing in said register an indication of detection result; and
   means for turning off said driver in response to said detection result obtained from said detection means.

8. The input/output device controller according to claim 7, wherein said detachable input/output device is a PC card that conforms to standards specified by PCMCIA/JEIDA, and wherein said input/output device controller is a PCMCIA controller.

9. The input/output device controller according to claim 7, wherein said driver is turned off when said driver enters the high state.

10. A power enabling mechanism, which controls a supply of operating power by an information processing apparatus to a detachable input/output device, said mechanism comprising:
   a first power line for supplying power at a first voltage level;
   a second power line for supplying power at a second voltage level;
   a first detector for detecting an over-current in said first power line;
   a second detector for detecting an over-current in said second power line;

disjunctive circuit means for logically adding the outputs of both said first and second detectors;

a first switch that is employed for connection and disconnection of said first power line;

first ON/OFF control means for turning on said first switch according to an instruction from said information processing apparatus and for turning off said first switch in response to said logical sum that is acquired by said disjunctive circuit means and for maintaining an OFF state until an instruction is received from said information processing apparatus;

a second switch that is employed for connection and disconnection of said second power line; and second ON/OFF control means for turning on said second switch according to an instruction from said information processing apparatus and for turning off said second switch in response to said logical sum that is acquired by said disjunctive circuit means and for maintaining an OFF state until an instruction is received from said information processing apparatus.

11. A power enabling mechanism, which controls supply of operating power from an information processing apparatus to a detachable input/output device, said mechanism comprising:

a first power line for supplying power at a first voltage level;

a second power line for supplying power at a second voltage level;

a first detector for detecting an over-current in said first power line;

a second detector for detecting an over-current in said second power line;

disjunctive circuit means for logically adding the outputs of both said first and second detectors;

a first switch that is employed for connection and disconnection of said first power line;

first ON/OFF control means for turning on said first switch according to an instruction from said information processing apparatus and for turning off said first switch in response to said logical sum that is acquired by said disjunctive circuit means and for maintaining an OFF state until an instruction is received from said information processing apparatus;

a second switch that is employed for connection and disconnection of said second power line;

second ON/OFF control means for turning on said second switch according to an instruction from said information processing apparatus and for turning off said second switch in response to said logical sum that is acquired by said disjunctive circuit means and for maintaining an OFF state until an instruction is received from said information processing apparatus; and means for supplying output from said disjunctive circuit to said information processing apparatus.

12. An input/output device controller, which permits an information processing apparatus to communicate with a detachable input/output device, said controller comprising:

an interface that is employed for data exchange with an input/output bus of said information processing apparatus;

a register for temporarily holding part of a data group that is to be exchanged;

a driver for transmitting a signal to said input/output device;

a power enabler for connecting and disconnecting a power line that joins said input/output device to a power source for operating said device in accordance with the contents stored in said register;

detection means for detecting an over-current in said power line;

holding means for holding a detection result until an instruction is received from said information processing apparatus; and means for turning off said driver in response to output from said holding means.

13. An input/output device controller, which permits an information processing apparatus to communicate with a detachable input/output device, said controller comprising:

an interface that is employed for data exchange with an input/output bus of said information processing apparatus;

a register for temporarily holding part of a data group that is to be exchanged;

a driver for transmitting a signal to said input/output device;

a power enabler for connecting and disconnecting a power line that connects said input/output device to a power source for operating said device in accordance with the contents stored in said register;

detection means for detecting an over-current in said power line;

holding means for holding a detection result until an instruction is received from said information processing apparatus;

means for storing in said register an indication of said detection result; and means for turning off said driver in response to an output of said holding means.

14. An input/output device controller according to claim 13, wherein said detachable input/output device is a PC card that conforms to standards specified by PCMCIA/JEIDA, and wherein said input/output device controller is a PCMCIA controller.

15. A power-enabling mechanism, which controls supply of operating power from an information processing apparatus to a detachable input/output device, said mechanism comprising:

a first power line for supplying power at a first voltage level from said information processing apparatus to said input/output device;

a second power line for supplying power at a second voltage level from said information processing apparatus to said input/output device;

a first detector within said information processing apparatus for detecting an over-current in said first power line;

a second detector within said information processing apparatus for detecting an over-current in said second power line;

disjunctive circuit means for logically adding the outputs of said first and second detectors;

a first switch for disconnection of power, to said detachable input/output device, which power is supplied through said first power line, said disconnection being made in response to the output of said disjunctive circuit means; and a second switch for disconnection of power, to said detachable input/output device, which power is supplied through said second power line, said disconnection being made in response to the output of said disjunctive circuit means.

* * * * *